United States Patent
Hsu et al.

(10) Patent No.: US 10,281,519 B2
(45) Date of Patent: May 7, 2019

(54) ABNORMALITY MEASURING METHOD AND ABNORMALITY MEASURING APPARATUS

(71) Applicant: INDUSTRIAL TECHNOLOGY RESEARCH INSTITUTE, Hsinchu (TW)

(72) Inventors: Yao-Chung Hsu, Yunlin County (TW); Sen-Chia Chang, Hsinchu (TW); Tsung-Jung Hsieh, Tainan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 212 days.

(21) Appl. No.: 15/286,394

(22) Filed: Oct. 5, 2016

(65) Prior Publication Data
US 2017/0276720 A1    Sep. 28, 2017

(30) Foreign Application Priority Data
Mar. 23, 2016   (TW) .............................. 105108996 A

(51) Int. Cl.
*G01R 31/26*   (2014.01)
*G08B 21/18*   (2006.01)

(52) U.S. Cl.
CPC ..... *G01R 31/2601* (2013.01); *G01R 31/2642* (2013.01); *G08B 21/18* (2013.01); *Y02P 90/30* (2015.11)

(58) Field of Classification Search
CPC ............ G01R 31/2601; G01R 31/2642; G08B 21/18; Y02P 90/30
See application file for complete search history.

(56) References Cited

U.S. PATENT DOCUMENTS

| | | | |
|---|---|---|---|
| 5,214,595 A | * | 5/1993 | Ozawa ................. G01R 15/142 324/536 |
| 6,397,114 B1 | | 5/2002 | Eryurek et al. |

(Continued)

FOREIGN PATENT DOCUMENTS

| | | |
|---|---|---|
| CN | 103025592 A | 4/2013 |
| CN | 102072829 B | 9/2013 |

(Continued)

OTHER PUBLICATIONS

Lee, J., et al., "Development of a Predictive and Preventive Maintenance Demonstration System for a Semiconductor Etching Tool", ECS Transactions, vol. 52, Issue 1, Mar. 2013, pp. 913-927.

(Continued)

*Primary Examiner* — Bryan Bui
(74) *Attorney, Agent, or Firm* — Maschoff Brennan

(57) ABSTRACT

An abnormality measuring method and an abnormality measuring apparatus of equipment are provided. The abnormality measuring method includes the following steps: acquiring a feature sequence corresponding to a life cycle according to recipe information and sensing information, wherein the feature sequence includes a plurality of feature subset sequences, and the life cycle is relative to a plurality of process runs; performing repeatedly a life segment analyzing process to acquire a plurality of life segments of the life cycle and each of the plurality of the feature subset sequences corresponding to one of the plurality of life segments; building a corresponding trending distribution of each of the plurality of life segments according to a corresponding feature subset sequence of the life segment; and determining whether to send an alarm message according to a plurality of trending distributions.

4 Claims, 8 Drawing Sheets

(56) References Cited

U.S. PATENT DOCUMENTS

| | | |
|---|---|---|
| 6,456,928 B1 | 9/2002 | Johnson |
| 7,774,651 B2 | 8/2010 | Mukherjee et al. |
| 8,620,519 B2 | 12/2013 | Mukherjee et al. |
| 2002/0078403 A1 | 6/2002 | Gullo et al. |
| 2007/0280706 A1 | 12/2007 | Yasukawa et al. |
| 2011/0231054 A1* | 9/2011 | Zhang ............... H01M 10/4207 701/31.4 |
| 2012/0029872 A1 | 2/2012 | Kuo |
| 2014/0336791 A1 | 11/2014 | Asenjo et al. |
| 2015/0356521 A1 | 12/2015 | Sridhar et al. |
| 2016/0062820 A1 | 3/2016 | Jones et al. |

FOREIGN PATENT DOCUMENTS

| | | |
|---|---|---|
| TW | 555929 B | 10/2003 |
| TW | I317868 B | 12/2009 |
| TW | 201023061 A1 | 6/2010 |

OTHER PUBLICATIONS

Maio, F.D., et al., "Ensemble-approaches for clustering health status of oil sand pumps", Expert Systems with Applications, vol. 39, Issue 5, Apr. 2012, pp. 4847-4859.
TW Office Action dated Dec. 30, 2016 as received in Application No. TW 105108996.

\* cited by examiner

ABNORMALITY MEASURING METHOD AND ABNORMALITY MEASURING APPARATUS

CROSS-REFERENCE TO RELATED APPLICATIONS

This non-provisional application claims priority under 35 U.S.C. § 119(a) on Patent Application No(s). 105108996 filed in Taiwan, R.O.C. on Mar. 23, 2016, the entire contents of which are hereby incorporated by reference.

TECHNICAL FIELD

The present application relates to a method, and an apparatus for measuring abnormality.

BACKGROUND

The existing abnormality measuring methods for abnormality (for example, failure or aging) of the semiconductor equipment could only determine the semiconductor equipment is healthy or abnormal. Just two states of healthy and abnormal couldn't reflect the actual status of the semiconductor equipment.

By the way, another one of the existing abnormality measuring methods for abnormality of the semiconductor equipment could assess the aging trend in the whole life cycle of the components of the semiconductor equipment cycle according to one single feature. However, as the changes of the life status of the semiconductor components, the features reflecting aging semiconductor components are different.

SUMMARY

One exemplary embodiment of the present disclosure relates to an abnormality measuring method. The method acquires a feature sequence corresponding to a life cycle according to a recipe information and a sensing information, wherein the feature sequence includes a plurality of feature subset sequences, and the life cycle is relative to a plurality of process runs, The method performs repeatedly a life segment analyzing process to acquire a plurality of life segments of the life cycle and each of the plurality of feature subset sequences corresponds to one of the plurality of life segments. The method builds a corresponding trending distribution of each of the plurality of life segments according to a corresponding feature subset sequence of the life segment, and determines whether to send an alarm message according to a plurality of trending distributions.

Another exemplary embodiment of the present disclosure relates to an apparatus for measuring abnormality. The apparatus includes a feature extraction module, a life segment analyzing module coupled to the feature extraction module, a Trending analyzing module coupled to the feature extraction module and the life segment analyzing module, and a warning module coupled to the tending analyzing module. The feature extraction module is used to acquire a feature sequence corresponding to a life cycle according to a recipe information and a sensing information, wherein the feature sequence includes a plurality of feature subset sequences, and the life cycle is related to a plurality of process run. The life segment analyzing module is used to perform repeatedly a life segment analyzing process and acquire a plurality of life segments of the life cycle and each of the plurality of feature subset sequences corresponds to one of the plurality of life segments. The Trending analyzing module is used to build a corresponding trending distribution of each of the plurality of life segments according to a corresponding feature subset sequence of the life segment. The warning module is used to determine whether to send an alarm message according to a plurality of trending distributions.

The foregoing will become better understood from a careful reading of a detailed description provided herein below with appropriate reference to the accompanying drawings.

DETAILED DESCRIPTION OF EXEMPLARY EMBODIMENTS

Figure 1:
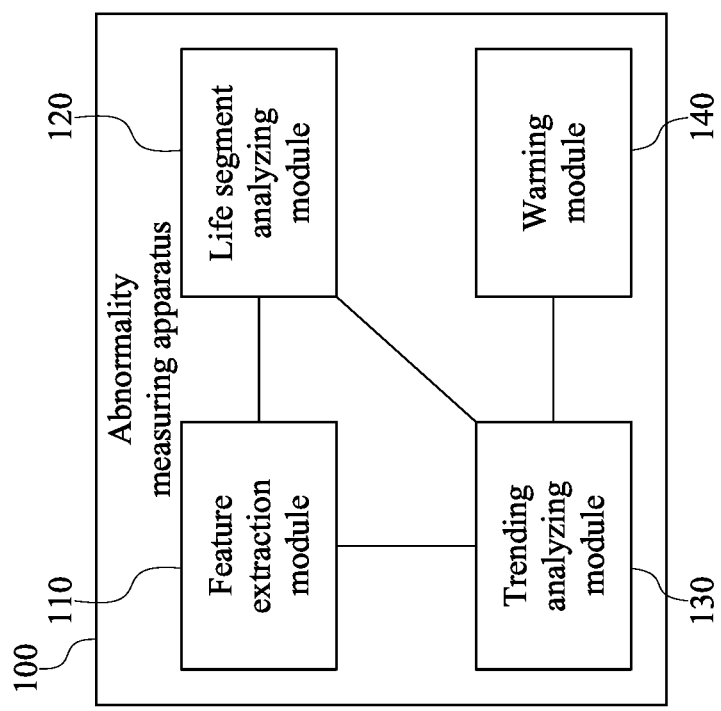
FIG. 1 is a block diagram illustrating an abnormality measuring apparatus, according to an exemplary embodiment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 is a block diagram illustrating an abnormality measuring apparatus, according to an exemplary embodiment. In FIG. 1, an abnormality measuring apparatus 100 includes a feature extraction module 110, a life segment analyzing module 120, a trending analyzing module 130, and a waring module 140. The life segment analyzing module 120 is coupled to the feature extraction module 110. The trending analyzing module 130 is coupled to the feature extraction module 110 and the life segment analyzing module 120. The waring module 140 is coupled to the trending analyzing module 130. The feature extraction module 110, the life segment analyzing module 120, the trending analyzing module 130, and a waring module 140 may be realized by any kind of processors, microprocessors, or chips without limitations. For example, The feature extraction module 110, the life segment analyzing module 120, the trending analyzing module 130, and a waring module 140 may be respectively realized by a first processor, a second processor, a third processor and a forth processor. In the following, please refer to FIG. 1 and FIG. 2.

Figure 2:
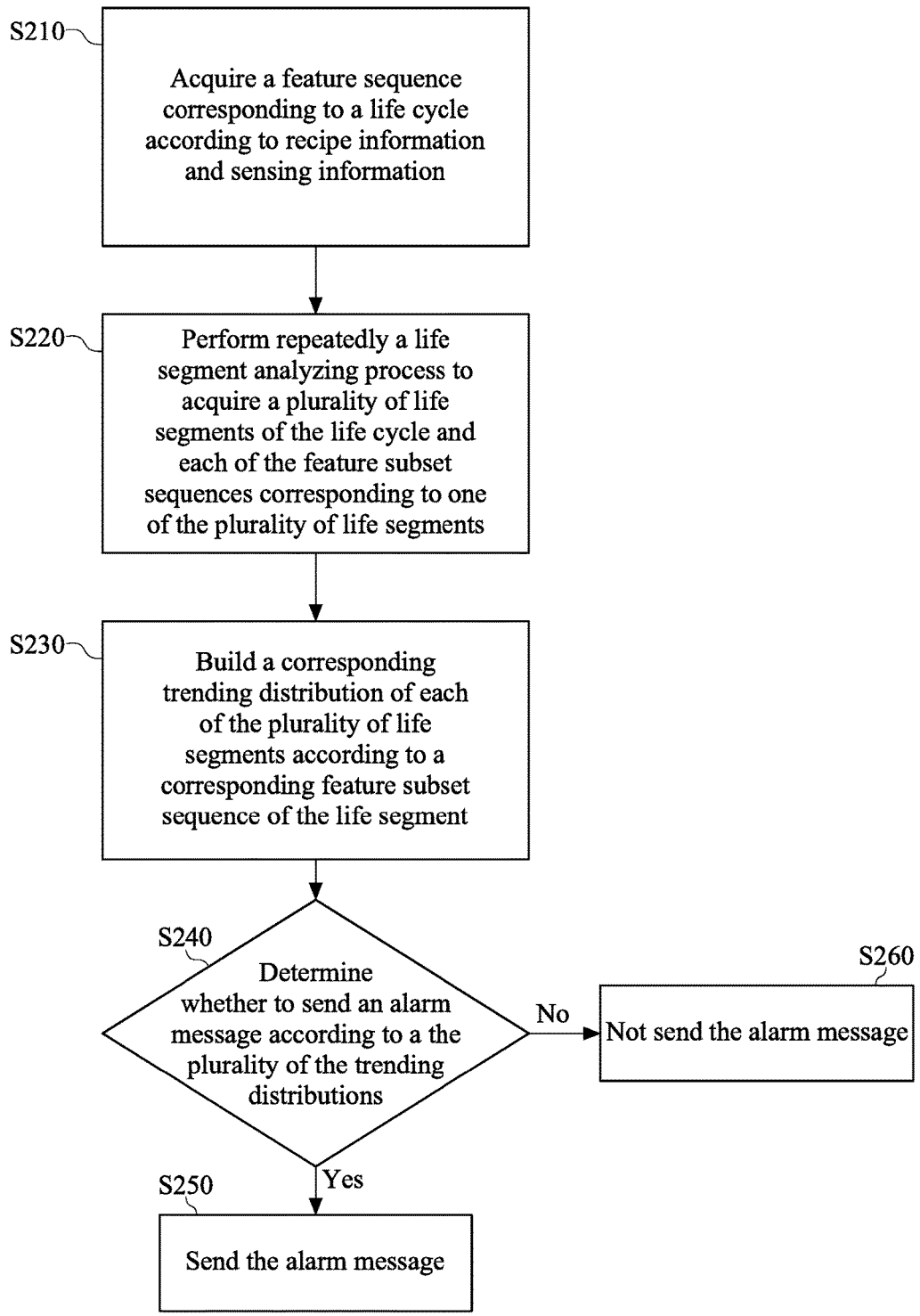
FIG. 2 is a flow diagram illustrating an abnormality measuring method, according to an exemplary embodiment.

FIG. 2 is a flow diagram illustrating an abnormality measuring method according to an exemplary embodiment. The abnormality measuring method includes steps S210~S260.

In a semiconductor manufacturing process, the life cycle of a component X may include a plurality of process runs.

In step S210, for the component X in the semiconductor manufacturing process, the feature extraction module 110 may acquire a feature sequence corresponding to a life cycle according to recipe information and sensing information. In one exemplary embodiment, the recipe information includes a plurality of recipe values. The plurality of recipe values are recipe set points. The sensing information includes a plurality of sensing values. Each of the sensing value corresponds to one of the plurality of recipe values. For example, at each process run, there is a recipe information (or recipe step) corresponding to a light emitting diode (LED). The recipe information includes a plurality of recipe values, for example, the heating temperature at a special time point. The sensing information corresponding to the said recipe step may be fetched by the related sensors. The sensing information includes a plurality of sensing values, for example, the sensing temperature at a special time point.

Figure 3:
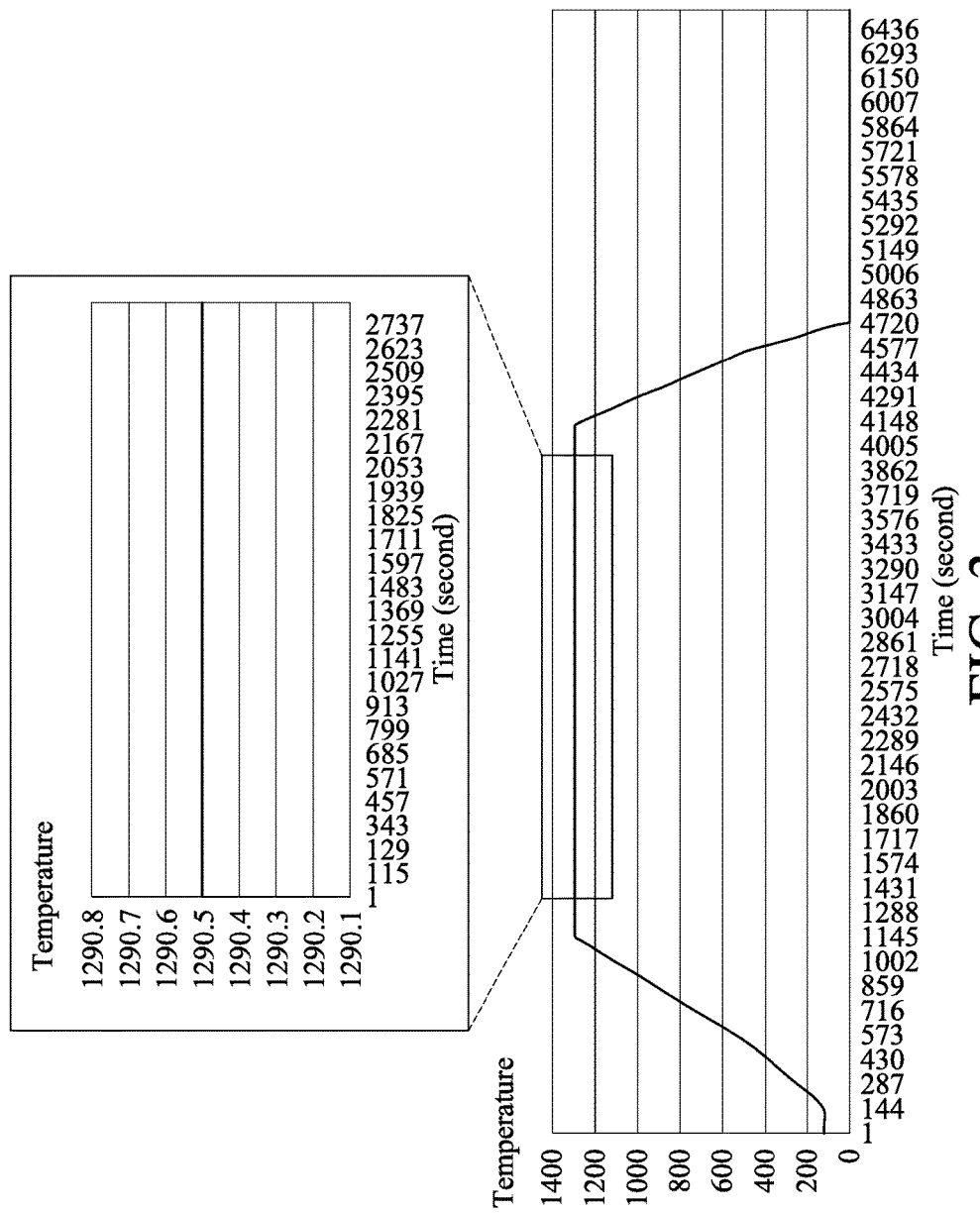
FIG. 3 is a diagram illustrating recipe information and sensing information and their partially enlarged diagram, according to an exemplary embodiment.

FIG. 3 is a diagram illustrating recipe information and a sensing information and partially enlarged schematic views thereof, according to an exemplary embodiment. The vertical axis represents Celsius, the horizontal axis represents time (in a unit of second), the solid line represents the recipe information, and the dotted line represents the sensing information. In the following, please refer to FIG. 1, FIG. 2 and FIG. 3.

In one exemplary embodiment of this disclosure, the feature sequence relates to a degree of deviation between the recipe information and the sensing information. In one exemplary embodiment of this disclosure, the feature sequence may be generated according to a difference value between each of the recipe values and its corresponding sensing value, and a timing sequence of the life cycle.

For example, in one situation, the feature extraction module 110 may calculate an average of difference values between a plurality of recipe values and a plurality of corresponding sensing values. An average of the difference values is considered as the feature value corresponding to the degree of deviation. In another situation, the feature extraction module 110 may calculate a maximum value of these difference values between the plurality of recipe values and the plurality of corresponding sensing values, and set the maximum value to be the feature value corresponding to the degree of deviation. Yet in another situation, the feature extraction module 110 may calculate difference values between the plurality of recipe values and the plurality of corresponding sensing values, and selects those difference values greater than a critical value to be feature values corresponding to the degree of deviation. The feature extraction module 110 may generate the said feature sequence (referred to as F) according to a plurality of feature values and a timing sequence corresponding said life cycle.

In one exemplary embodiment of this disclosure, the feature sequence F may be composed of all feature vectors at all process runs, which are obtained by calculating said each difference value between said each recipe value and its corresponding sensing value at each process run. Referred to table 1 and Table 2, the feature sequence F may be {Mean, std, Max, Min, Range, Kurtosis, Skewness, RMS}. Wherein, Mean is an average value, std is a standard deviation, Max is a maximum value, Min is a minimum value, Range is a range, Kurtosis is a kurtosis, Skewness is a skewness, and RMS is a mean square Table 1 and Table 2 are sequence of feature vectors related to a plurality of process run numbers according to one embodiment of this disclosure.

TABLE 1

| Run | Mean | std | Max | Min |
|-----|------|-----|-----|-----|
| 363 | 0.17341176 | 0.027167047 | 0.20588235 | 0.12352941 |
| 365 | 0.19486859 | 0.025815622 | 0.22941176 | 0.14705882 |
| 367 | 0.18673342 | 0.025896801 | 0.21764706 | 0.14117647 |
| 369 | 0.21309656 | 0.029899213 | 0.25294118 | 0.15882353 |
| 371 | 0.17944209 | 0.066299488 | 0.27058824 | 0.07647059 |

TABLE 2

| Run | Range | Kurtosis | Skewness | RMS |
|-----|-------|----------|----------|-----|
| 363 | 0.082352941 | −1.2607203 | −0.3226644362 | 0.17552689 |
| 365 | 0.082352941 | −1.1612369 | −0.4286145983 | 0.19657114 |
| 367 | 0.076470588 | −1.2752570 | −0.3629301704 | 0.18852059 |
| 369 | 0.094117647 | −1.2059249 | −0.3897615016 | 0.21518389 |
| 371 | 0.194117647 | −1.4481707 | −0.0489579452 | 0.19129842 |

For example, the feature vector at the process run 363 is (0.17341176, 0.027167047, 0.20588235, 0.12352941, 0.082352941, −1.2607203, −0.3226644362, 0.17552689). The feature sequence F is composed of all feature vectors. For illustration only, Table 1 and Table 2 do not list all feature vectors at all process runs.

In one embodiment of this disclosure, the feature sequence may include a plurality of feature subset sequences. For example, while the feature sequence F is {Mean, std, Max, Min, Range, Kurtosis, Skewness, RMS}, a feature subset sequence Z may be {Mean, Max, Min} or {Mean, Max, Min, Kurtosis, Skewness}, and so on. In other words, the feature subset sequence Z may be a sequence composed of the feature vectors included in a subset of F. The aforementioned feature values are used for explanation only, the scope of the disclosure is not limited thereto.

Figure 4:
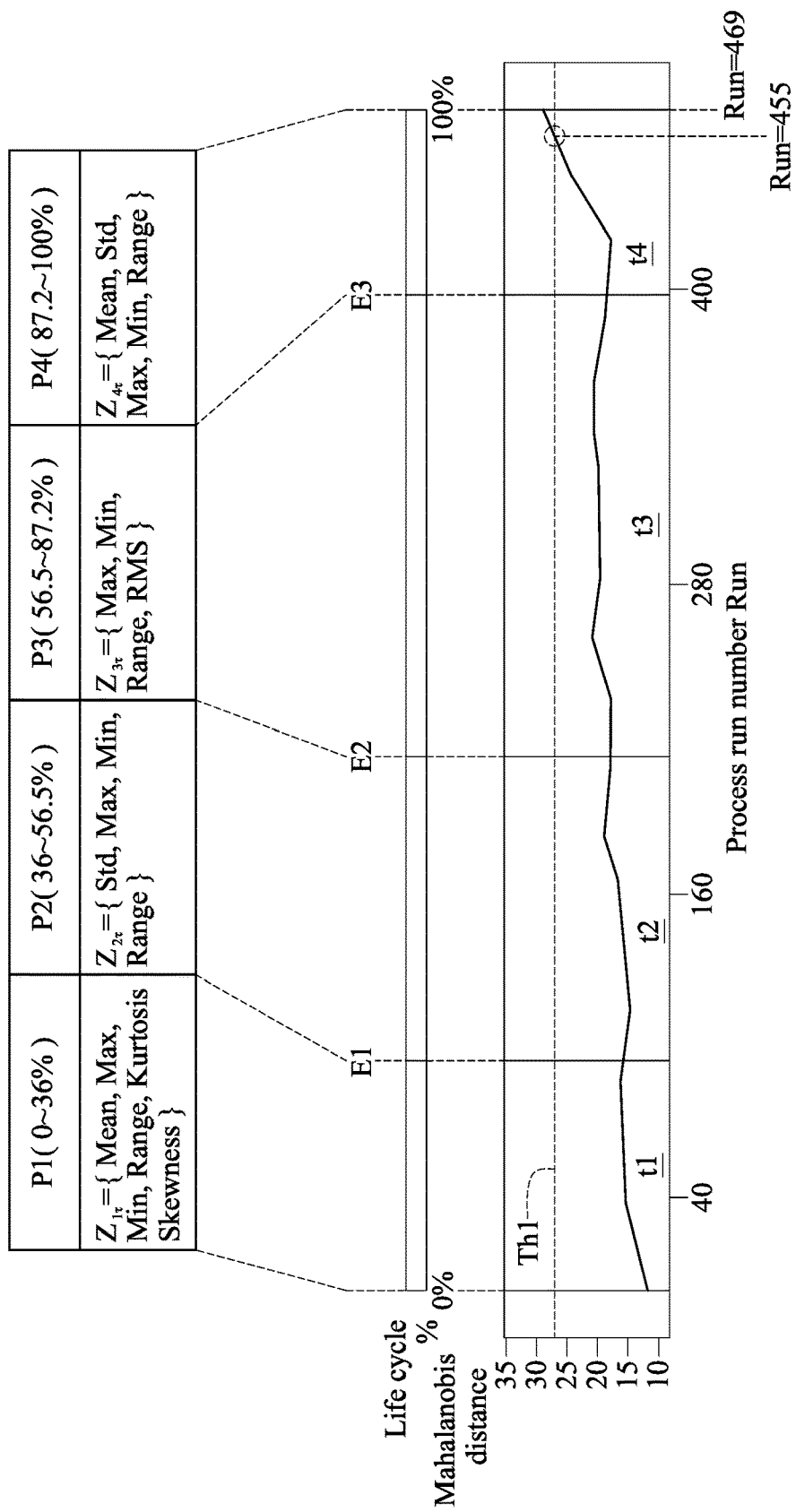
FIG. 4 is a diagram illustrating a life cycle, the segments of the life cycle and the corresponding feature subset sequences, according to an exemplary embodiment.

FIG. 4 is a diagram illustrating a life cycle, the life segments of the life cycle and corresponding feature subset sequences thereof according to an exemplary embodiment of this disclosure. Please refer to FIG. 1, FIG. 2 and FIG. 4.

In step S220, the life segment analyzing module 120 may perform repeatedly a life segment analyzing process to acquire a plurality of life segments of the life cycle and the feature subset sequence corresponding to one of the plurality of life segments.

In FIG. 4, by repeatedly performing a life segment analyzing process, the life segment analyzing module 120 may acquire respectively a life segment P1 corresponding to 0~36% of the life cycle, a life segment P2 corresponding to 36~56.5% of the life cycle, a life segment P3 corresponding to 56.5~87.2% of the life cycle, and a life segment P4 corresponding to 87.2~100% of the life cycle. The feature set of a feature subset sequence $Z_{1\ \tau}$ corresponding to the life segment P1 is {Mean, std, Max, Min, Range, Kurtosis, Skewness}. The set of feature values of a feature subset sequence $Z_{2\ \tau}$ corresponding to the life segment P2 is {std, Max, Min, Range}. The set of feature values of a feature subset sequence $Z_{3\ \tau}$ corresponding to the life segment P3 is {Max, Min, Range, RMS}. The set of feature values of a feature subset sequence $Z_{4\ \tau}$ corresponding to the life segment P4 is {Mean, std, Max, Min, Range}.

For example, the life cycle of human may be divided by four life segments, such as childhood, adolescence, middle age and old age. Wherein, the main features of the health assessment may be different. For example, in the childhood, the main features of the health assessment may be relative to bone, muscle and respiratory tract. In the adolescence, the main features of the health assessment may be relative to cholesterol, and liver index. In the middle age, the main features of the health assessment may be relative to glucose, blood pressure, cardiovascular and renal function. In the old age, the main features of the health assessment may be relative to gastrointestinal tract, bone density and heart. The same situation also exists in the semiconductor manufacturing process. In assessing the abnormality (for example, failure or aging) of the semiconductor equipment, different life segments may correspond to different feature subset sequences, respectively. The development trend of each life segment of the semiconductor equipment may be reflected more exactly by the corresponding feature subset sequence of the life segment.

In step S230, the trend analyzing module 130 may build a corresponding trending distribution of each of the plurality of life segments according to a corresponding feature subset sequence of the life segment. As shown in FIG. 4, the trend analyzing module 130 may build corresponding trending distributions t1~t4 for life segments P1~P4, respectively.

In step S240, the warning module 140 may determine whether to send an alarm message according to a plurality of trending distributions. In FIG. 4, a replacement point of known components occurs at the timing point of the process run 469. The warning module 140 may send an alarm in advance at the timing point of the process run 455 (as shown in step S250). If the determination is not to send the alarm message, then no alarm message will be sent in the step S260.

The following further describes the life segment analyzing process performed by the life segment analyzing module 120.

Figure 5A:
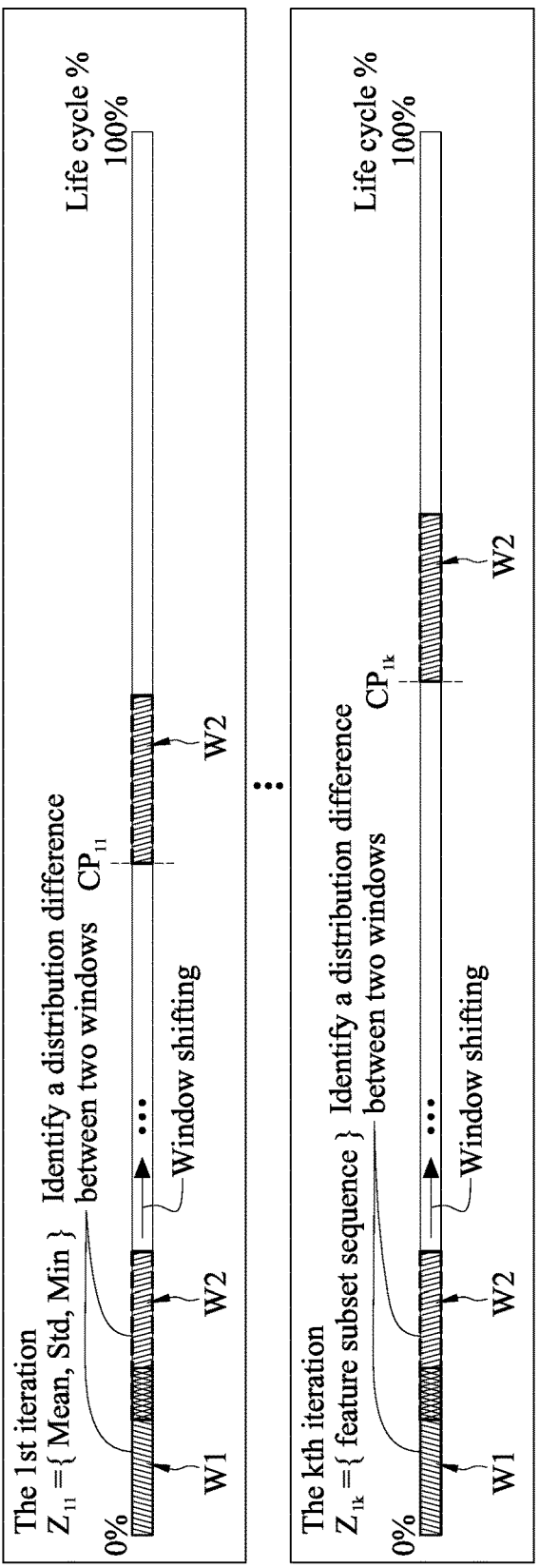
FIGS. 5A and 5B are diagrams illustrating the analyzing procedures of the segments of the life cycle, according to an exemplary embodiment.
Figure 5B:
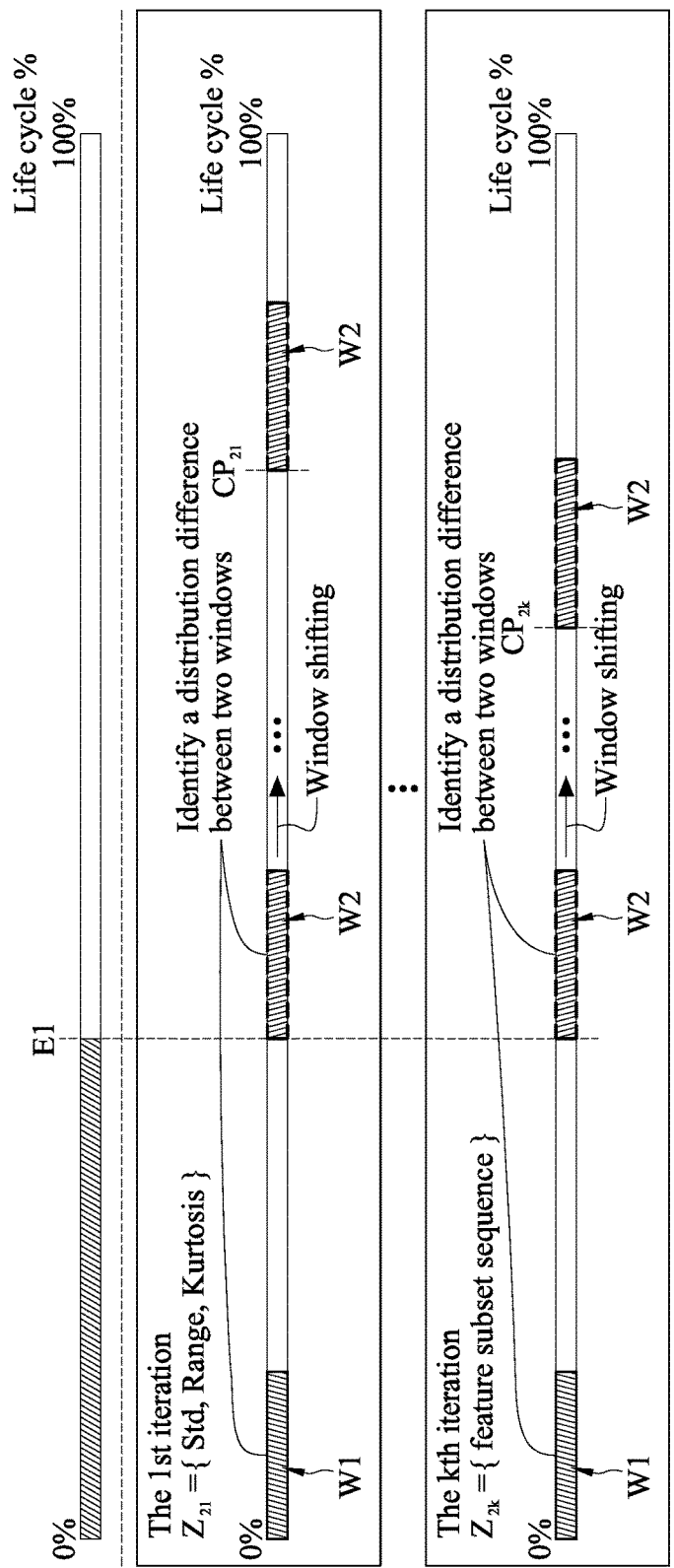
Figure 6:
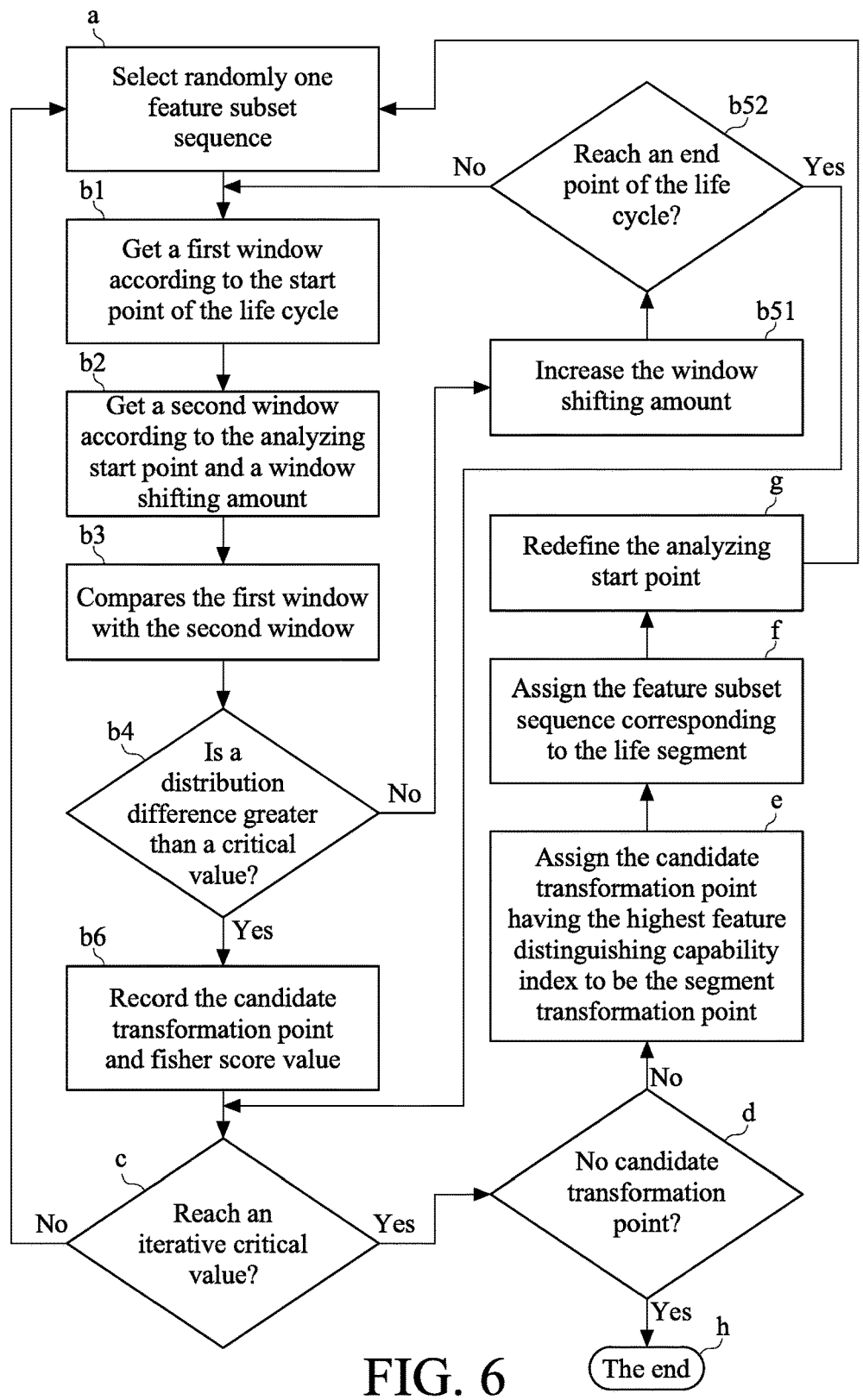
FIG. 6 is a flow diagram illustrating an abnormality measuring method, according to an exemplary embodiment.

FIGS. 5A and 5B are diagrams illustrating the analyzing procedures of the life segments of the life cycle according to an exemplary embodiment. FIG. 6 is a flow diagram illustrating an abnormality measuring method, according to an exemplary embodiment. Please refer to FIG. 1, FIG. 4, FIG. 5A~5B and FIG. 6.

In one embodiment of this disclosure, in the step S220, the life segment analyzing module 120 performs the life segment analyzing process according to an analyzing start point to acquire a segment transformation point corresponding to one of the plurality of life segments, and redefines repeatedly the analyzing start point according to a latest acquired segment transformation point (step g) until no more segment transformation point is acquired (step h). An initial analyzing start point is defined according to the start point of the life cycle.

As shown in FIG. 5A, the life segment analyzing module 120 will define the initial analyzing start point according to the start point of the life cycle (that is, the first process run). After performing the life segment analyzing process, a segment transformation point E1 corresponding to life segment P1 will be acquired. As shown in FIG. 5B, the life segment analyzing module 120 will define the segment transformation point E1 to be the next analyzing start point, and perform the life segment analyzing process again to acquire a segment transformation point E2 corresponding to life segment P2 (not illustrated in FIG. 5B). The above steps will be performed repeatedly until no more segment transformation point is acquired (or no more candidate segment transformation point is acquired, which will be described later).

In details, the above life segment analyzing process may include the following steps a~f.

In step a, the life segment analyzing module 120 will select randomly one feature subset sequence from a plurality of feature subset sequences. For example, as shown in FIG. 5A, during the process to acquire the segment transformation point E1, a feature subset sequence $Z_{11}$={Mean, std, Min} may be selected randomly in the first iteration. Or, as shown in FIG. 5B, during the process to acquire the segment transformation point E2, a feature subset sequence $Z_{11}$={std, Range, Kurtosis} may be selected randomly in the first iteration.

In step b, the life segment analyzing module 120 may analyze a distribution status for each of selected feature subset sequences starting from the analyzing start point, to acquire a corresponding candidate transformation point and a feature distinguishing capability index of the candidate transformation point. In one of the embodiments of this disclosure, the feature distinguishing capability index is a Fisher score corresponding to the candidate transformation point. In more details, the above step b may include the following steps b1~b6.

In step b1, the life segment analyzing module 120 may get a first window in a selected feature subset sequence, according to the start point of the life cycle.

In step b2, the life segment analyzing module 120 may get a shifting reference point and a second window corresponding to the shifting reference point in the selected feature subset sequence, according to the defined analyzing start point and a window shifting amount. In one embodiment of this disclosure, the window lengths of both the first window W1 and the second window W2 may be 10% of the life cycle. The window shifting amount may be 5% of the life cycle, but the scope of the disclosure is not limited thereto.

In step b3, the life segment analyzing module 120 compares the first window with the second window.

In step b4, the life segment analyzing module 120 may identify whether a distribution difference of the second window with respect to the first window is greater than a critical value. In one embodiment of this disclosure, the life segment analyzing module 120 may identify whether a distribution difference of the second window with respect to the first window is greater than a critical value by using an algorithm referred to as Hotelling's T2.

In step b51, when the distribution difference of the second window with respect to the first window is not great than the critical value, the life segment analyzing module 120 may increase the window shifting amount, that is, shifting the second window W2. Repeating the above steps b1~b4 until a shifting reference point reaches an end point of the life cycle, as shown in step b52.

In step b6, the life segment analyzing module 120 will define the shifting reference point to be the candidate transformation point while the distribution difference of the second window W2 with respect to the first window W1 is greater than the critical value, and record the candidate transformation point and the Fisher score thereof to finish this iteration. In FIG. 5A, during the process of acquiring the segment transformation point E1, the candidate transformation point $CP_{11}$ is acquired in the first iteration. The candidate transformation point CP1$k$ is acquired in the k iteration.

In step c, the life segment analyzing module 120 will determine whether an iteration number for the analyzing start point process reaches an iterative critical value. While the iteration number is less than an iterative critical value k, the life segment analyzing module 120 will repeat the above steps a and b. The iterative critical value k may be, but not limited to 5000.

In step d, while the iteration number is greater than the iterative critical value k, the life segment analyzing module 120 may determine whether the analyzing start point has a candidate transformation point or not, according to the said record. When there is no candidate transformation point, the process comes to an end, as shown in step h.

In step e, while there is a candidate transformation point, the life segment analyzing module 120 will assign the candidate transformation point having the highest feature distinguishing capability index to be the segment transformation point, to get the corresponding life cycle. For example, as shown in FIG. 5A, the life segment analyzing module 120 may assign the candidate transformation point $CP_{1\tau}$ having the highest Fisher score among the candidate transformation point $CP_{11}$~$CP_{1k}$ to be the segment transformation point E1. Similarly, as shown in FIG. 5B, the life segment analyzing module 120 may assign the candidate transformation point $CP_{2\tau}$ having the highest Fisher score among the candidate transformation point $CP_{21}$~$CP_{2k}$ to be the segment transformation point E2 (not illustrated in the Figure).

In step f, the life segment analyzing module 120 will assign the feature subset sequence $Z_{1\tau}$, to which the candidate transformation point $CP_{1\tau}$ having the highest feature distinguishing capability index corresponds, to be the feature subset sequence that the life segment P1 corresponds to. In one embodiment of this disclosure, the trend analyzing module 130 may further train a health model corresponding to each life segment of a plurality of life segments of the life cycle according to a corresponding feature subset sequence of the life segment, and acquire a corresponding trending distribution of said each life segment according to the health model of said each life segment. In one embodiment of this disclosure, each of the tending distributions relates to a Mahalanobis distance between the data in the life segment of the corresponding feature subset sequence and the data in the first window of the start point of the life cycle. That is, the said data of the first window is health data. Each trending distribution corresponding to a life segment is obtained by comparing each data at each process run in the life segment (corresponding to the second window) with the health data (corresponding to the first window), as shown in trending distributions t1~t4 of FIG. 4.

In one embodiment of this disclosure, the warning module 140 may further generate an alarm message according to the trending distribution, as shown in a warning threshold Th1 of FIG. 4.

The warning module may further compare the trending distribution with the warning threshold to determine whether to announce the alarm message or not. As shown in FIG. 4, a replacement point of known components occurs at the timing point of the process run 469. The warning module 140 may send an alarm in advance at the timing point of the process run number 455 while the trending distribution t4 and the warning threshold Th1 are intersected.

In another embodiment of this disclosure, for the aforementioned component X in the semiconductor manufacturing process, the life segment analyzing module 120 may acquire feature subset sequences $Z_{1\tau}$~$Z_{4\tau}$ corresponding to life segments P1~P4, respectively. The feature subset sequences $Z_{1\tau}$~$Z_{4\tau}$ may be used to analyze life segments of another component Y (having the same kind of the component X).

For example, while the life segment analyzing module 120 acquires the first life segment P1' for the component Y, the life segment analyzing module 120 may refer to the feature set of the feature subset sequence $Z1_\tau$ corresponding to the life segment P1, which is {Mean, std, Max, Min, Range, Kurtosis, Skewness} for the component X. While the life segment analyzing module 120 acquires the first life segment P2' for the component Y, the life segment analyzing module 120 may refer to the feature set of the feature subset sequence $Z_{2\tau}$ corresponding to the life segment P2, which is {Std, Max, Min, Range} for component X. While the life segment analyzing module 120 acquires the first life segment P3' for the component Y, the life segment analyzing module 120—may refer to the feature set of the feature subset sequence $Z_{3\tau}$ corresponding to the life segment P3, which is {Max, Min, Range, RMS} for the component X. While the life segment analyzing module 120 acquires the first life segment P4' for the component Y, the life segment analyzing module 120—may refer to the feature set of the feature subset sequence $Z_{4\tau}$ corresponding to the life segment P4, which is {Mean, Std, Max, Min, Range} for the component X.

So, the analyzing of the abnormality (for example, failure or aging) of the semiconductor equipment for the component Y may be accelerated.

Figure 7:
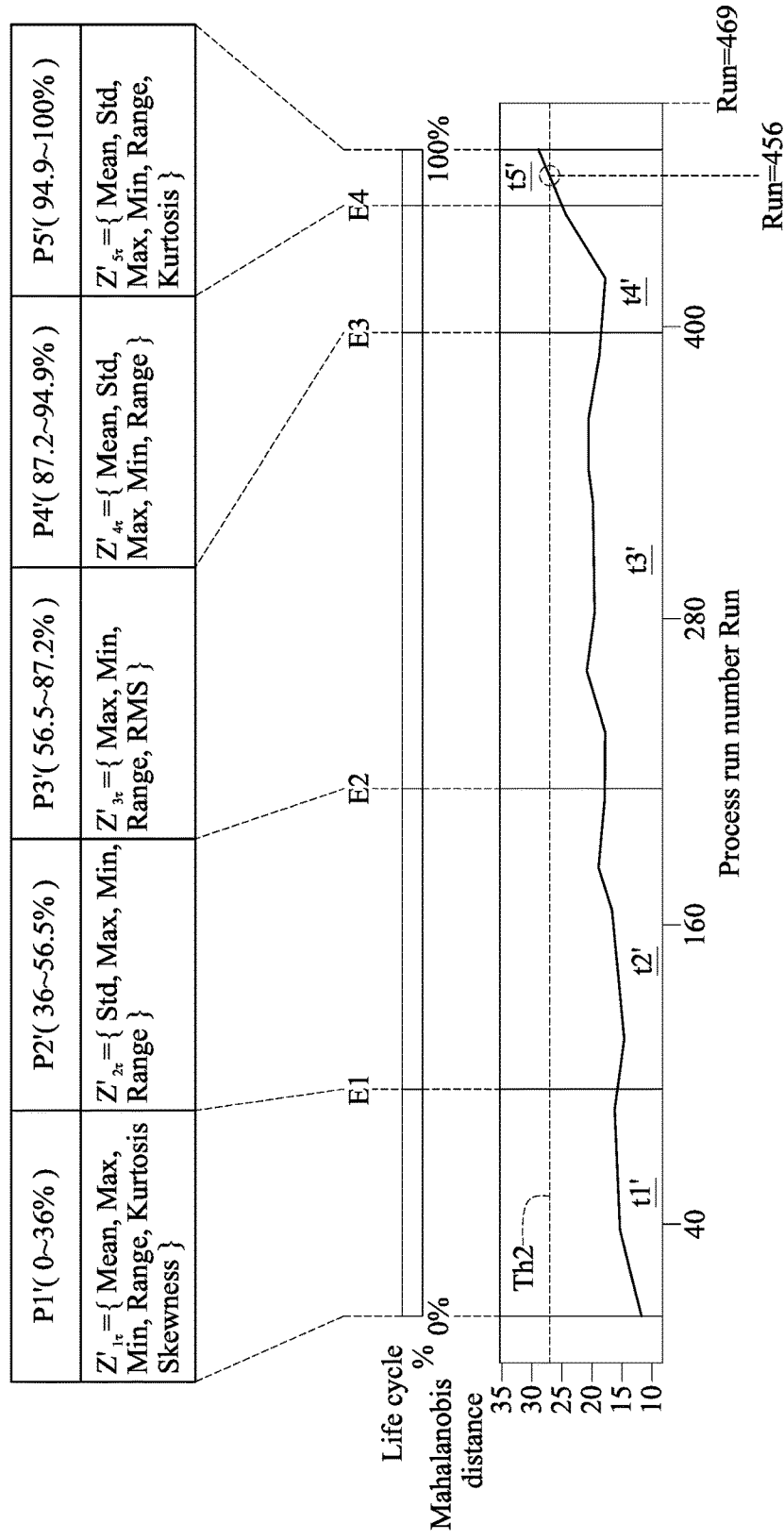
FIG. 7 is a diagram illustrating a life cycle, the life segments of the life cycle and the corresponding feature subset sequences, according to another exemplary embodiment.

FIG. 7 is a diagram illustrating a life cycle, the life segments of the life cycle and the corresponding feature subset sequences, respectively, according to another exemplary embodiment. Please refer to FIG. 1 and FIG. 7.

Similarly, the trend analyzing module 130 may build each of the tending distributions corresponding to the life segments of the life cycle, according to the corresponding feature subset sequence of each life segment of the life cycle. As shown in FIG. 7, the trend analyzing module 130 may acquire the trending distributions t1'~t5' corresponding to life segments P1'~P5', respectively.

In FIG. 7, by repeatedly performing a life segment analyzing process, the life segment analyzing module 120 may acquire respectively a life segment P1' corresponding to 0~36% of the life cycle a life segment P2' corresponding to 36~56.5% of the life cycle, a life segment P3' corresponding to 56.5~87.2% of the life cycle, a life segment P4' corresponding to 87.2~94.9% of the life cycle, and a life segment P5' corresponding to 94.9~100% of the life cycle. The feature set of the feature subset sequence $Z_{1\tau}$ corresponding to the life segment P1' is {Mean, std, Max, Min, Range, Kurtosis, Skewness}. The feature-set of the feature subset sequence $Z_2\tau$ corresponding to the life segment P2' is {std, Max, Min, Range}. The feature set of the feature subset sequence $Z_{3\tau}$ corresponding to the life segment P3' is {Max, Min, Range, RMS}. The feature set of the feature subset sequence $Z_{4\tau}$ corresponding to the life segment P4' is {Mean, std, Max, Min, Range}. The feature set of the feature subset sequence $Z_{5\tau}$ corresponding to the life segment P5' is {Mean, std, Max, Min, Range, Kurtosis}.

Not as the exemplary embodiment in FIG. 4, the life segment analyzing module 120 may determine the window lengths of both the first window and the second window according to the analyzing start point. In the present embodiment of the disclosure, the life segment analyzing module 120 may further determine the window shift amount according to a defined analyzing start point.

For example, as shown in FIG. 7, during the process of acquiring the segment transformation points E1~E3, the window lengths of both the first window W1 and the second window W2 may be 5% of the life cycle. The window shifting amount may be 2.5% of the life cycle, but the scope of the disclosure is not limited thereto.

In one embodiment of this disclosure, the warning module 140 may further generate an alarm message according to the trending distribution, as shown in the warning threshold Th1 of FIG. 4.

This disclosure may determine the abnormality (for example, failure or aging) of the semiconductor equipment more exactly, and know the development trend correctly. As shown in FIG. 7, the warning module 140 may compare the trending distribution t5' with the warning threshold to determine whether they are intersected or not at the timing point of the process run 456. Compared with FIG. 4, the timing of sending the alarm message for this embodiment of the disclosure is closer to that of occurring the abnormality (for example, failure or aging) of the semiconductor equipment.

In summary, our disclosure may perform repeatedly a life segment analyzing process to acquire a plurality of life segments of the life cycle and each of the plurality of feature subset sequences corresponding to one of the plurality of life segments, and build a corresponding trending distribution of each of the plurality of life segments according to a corresponding feature subset sequence of said each life segment, and determine whether to send an alarm message or not. Thus, this disclosure may select appreciate feature values according to different segments of life cycle of the semiconductor manufacturing process (initial stage, early stage, middle stage or last stage) to build more accurate health module(s) to reflect more exactly health trend of the semiconductor equipment.

The specification has described a measuring method and a measuring apparatus, for monitoring the equipment. The illustrated steps are set out to explain the exemplary embodiments shown, and it should be anticipated that ongoing technological development will change the manner in which particular functions are performed. Thus, these examples are presented herein for purposes of illustration, and not limitation. For example, steps or processes disclosed herein are not limited to being performed in the order described, but may be performed in any order, and some steps may be omitted, consistent with disclosed embodiments. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments.

Furthermore, the processors for this disclosure could be computers, processors, microprocessors, chips, SoC (System on Chip), SoP (System on Package), SiP (System in package), ASIC (Application-specific integrated circuit), and so on.

It will be apparent to those skilled in the art that various modifications and variations can be made to the disclosure. It is intended that the specification and examples be considered as exemplary embodiments only, with a scope of the disclosure being indicated by the following claims and their equivalents.

What is claimed is:

1. An apparatus for measuring abnormality, comprising:
   a feature extraction module, acquiring a feature sequence corresponding to a life cycle according to a recipe information and a sensing information, wherein the feature sequence includes a plurality of feature subset sequences, and the life cycle is related to a plurality of process runs, the apparatus has the recipe information at each process run, the recipe information includes a plurality of recipe values, the recipe values are recipe set points, and the sensing information corresponding to the recipe information is fetched by sensors;
   a life segment analyzing module coupled to the feature extraction module, performing repeatedly a life segment analyzing process to acquire a plurality of life segments of the life cycle and each of the plurality of feature subset sequences corresponding to one of the plurality of life segments, wherein the life segment analyzing module further performs the life segment analyzing process according to a analyzing start point to acquire a segment transformation point corresponding to one of the plurality of life segments, and redefines repeatedly the analyzing start point according to the segment transformation point until no more segment transformation point is acquired; wherein an initial analyzing start point is defined according to a start point of the life cycle;
   a trending analyzing module coupled to the feature extraction module and the life segment analyzing module, building a corresponding trending distribution of each of the plurality of life segments according to a corresponding feature subset sequence of the life segment; and
   a warning module coupled to the trending analyzing module, generating a warning threshold correspondingly according to the plurality of trending distributions, and comparing the plurality of trending distributions with the warning threshold to determine whether to announce an alarm message.

2. The apparatus of claim 1, wherein the life segment analyzing process includes:
   selecting randomly one feature subset sequence from the plurality of feature subset sequences;
   analyzing each of the plurality of feature subset sequences for a corresponding distribution status starting from the analyzing start point to acquire a candidate transformation point and a feature distinguishing capability index of the candidate transformation point;
   repeating the above steps until reaching an iterative critical value;
   defining the candidate transformation point having a highest feature distinguishing capability index to be the segment transformation point; and
   defining a feature subset sequence corresponding to the segment transformation point having the highest feature distinguishing capability index to be the feature subset sequence of the life segment.

3. The apparatus of claim 2, the life segment analyzing module further gets a first window according to the start point of the life cycle in a selected feature subset sequence, and gets a shifting reference point and a second window corresponding to the shifting reference point in the selected feature subset sequence, then analyzes the start point according to the analyzing start point and a window shifting amount, and compares the first window with the second window to identify whether a distribution difference of the second window corresponding to the first window is greater than a critical value, and repeats the above steps while the distribution difference of the second window with respect to the first window is less than a critical value until the shifting reference point reaches an end point of the life cycle, and defines the shifting point to be the candidate transformation point while the distribution difference of the second window with respect to the first window is greater than the critical value.

4. The apparatus of claim 2, wherein the life segment analyzing module further determines window lengths of both the first window and the second window according to the analyzing start point.

\* \* \* \* \*